United States Patent [19]

Klekotka et al.

[11] Patent Number: 4,856,032
[45] Date of Patent: Aug. 8, 1989

[54] HIGH SPEED PROGRAMMABLE FREQUENCY DIVIDER AND PLL

[75] Inventors: James E. Klekotka; David L. Dilley, both of Mesa, Ariz.

[73] Assignee: Motorola, Inc., Schaumburg, Ill.

[21] Appl. No.: 2,474

[22] Filed: Jan. 12, 1987

[51] Int. Cl.$^4$ .............................................. H03K 21/00
[52] U.S. Cl. ........................................ 377/47; 377/52; 331/1 A
[58] Field of Search ................... 331/25, 1 A; 377/47, 377/48, 52, 39; 364/703

[56] References Cited

U.S. PATENT DOCUMENTS

| | | | |
|---|---|---|---|
| 3,230,352 | 1/1966 | Grondin et al. | |
| 3,982,199 | 9/1976 | Green | 331/51 |
| 4,241,408 | 12/1980 | Gross | 364/703 |
| 4,518,920 | 5/1985 | Warner et al. | 328/14 |
| 4,606,059 | 8/1986 | Oida | 377/47 |
| 4,633,194 | 12/1986 | Kikuchi et al. | 377/47 X |

OTHER PUBLICATIONS

ECL Data Book, "Making Programmable UHF Counters When None Are Available or Pulse Swallowing Revisited", Fairchild Journal of Semiconductor Progress, vol. 3, No. 4.

Primary Examiner—Eugene R. LaRoche
Assistant Examiner—Robert J. Pascal
Attorney, Agent, or Firm—Frank J. Bogacz

[57] ABSTRACT

A phase locked loop including a programmable frequency divider with a variable modulus divider (VMD) having two modes of operation, n and n+1, a programmable counter for counting the number of times the VMD divides the input signal and a comparator for comparing the count in the counter to a predetermined number and switching the VMD from the first mode to the second mode when the instant count and predetermined number are equal. The programmable counter provides an output pulse each time the total count equals a selected number. The VMD is a GaAs semiconductor device.

5 Claims, 1 Drawing Sheet

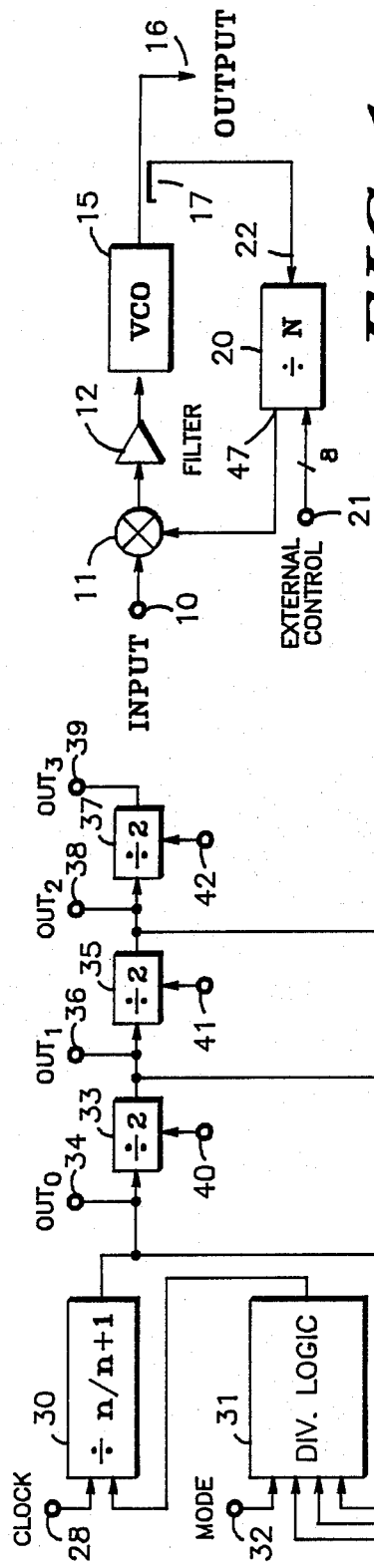
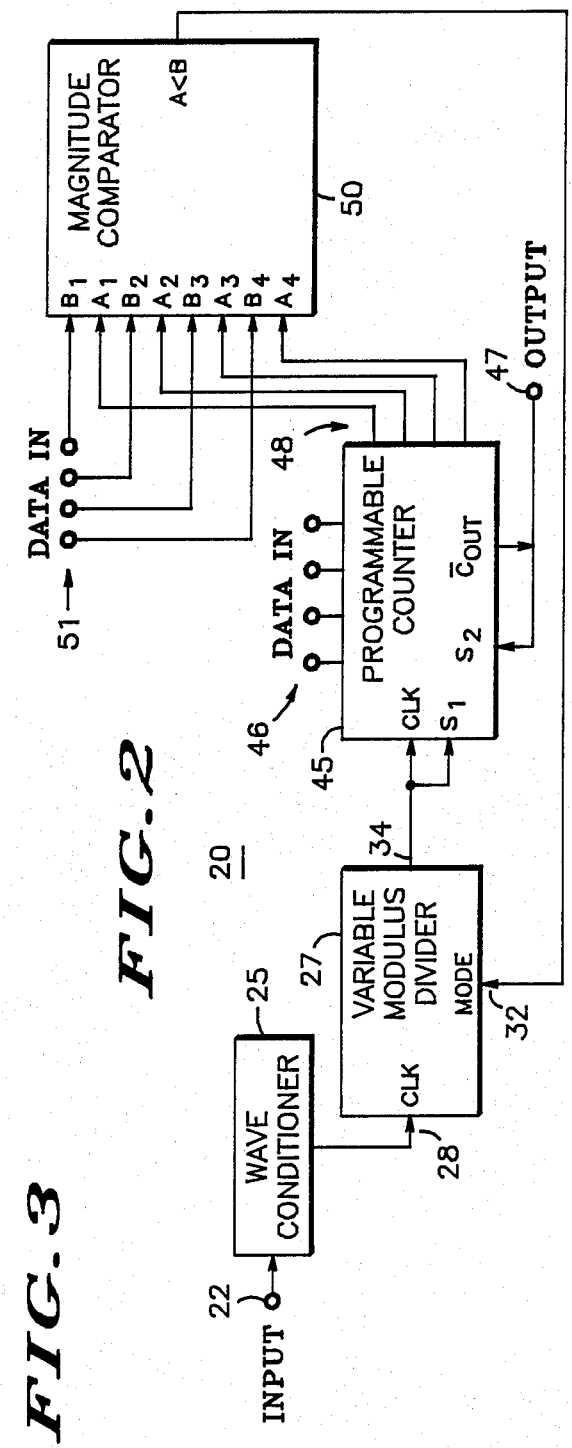
FIG. 1
FIG. 2
FIG. 3

HIGH SPEED PROGRAMMABLE FREQUENCY DIVIDER AND PLL

BACKGROUND OF THE INVENTION

As communication systems become more advanced the need for more efficient frequency generation becomes necessary. Frequency sources have been developed using techniques varying from complex mixing processes to digital synthesis. At the present time, attempts to design and construct fast hopping frequency sources are prevalent. One of the main building blocks in a fast hopping frequency source is a phase locked loop (PLL) circuit designed to step through a range of frequencies with a given increment.

A PLL circuit capable of stepping through a range of frequencies with a given increment generally includes a programmable frequency divider with consecutive integer division. Current techniques incorporate emitter controlled logic (ECL) modulus dividers and two or more counters in a pulse swallowing configuration to achieve consecutive integer division. The maximum operating frequency is approximately 600 MHz but the low value division (approximately 90) is sacrificed. Other designs make use of high frequency prescalers to reduce the input frequency. The problem with this technique is the loss of consecutive integer division. Because the frequencies in communications systems are continuously expanding into the higher bands of frequencies, it is necessary to increase the frequency response of the PLL and, hence, the programmable frequency divider therein. Unfortunately, higher frequency requires more power and a greater chip count.

SUMMARY OF THE INVENTION

The present invention pertains to a PLL with a high speed programmable frequency divider therein, which programmable frequency divider includes a variable modulus divider (VMD) connected in the PLL to receive the output signal therefrom and divide the signal by a selected one of a plurality of modes, a programmable counter connected to the VMD to count the number of times the input signal is divided by the various modes of the VMD and to provide an output pulse to the PLL when the total count is equivalent to a selected number, and a signal comparator connected to compare the instant count in the programmable counter with a predetermined number and to supply a signal to the mode control of the VMD to change the mode when the instant count from the programmable counter is equal to the predetermined number. A wave conditioning circuit may be attached in the circuit prior to the input of the VMD to convert the input sinusoidal signals to fast rising pulses and, thereby, increase the lower frequency of the circuit. Also, the VMD and wave conditioning circuit may be gallium arsenide semiconductor devices to further improve the speed and frequency response.

It is an object of the present invention to provide a new and improved high speed programmable frequency divider.

It is a further object of the present invention to provide a high speed programmable frequency divider with a greatly increased range and consecutive integer division over the range.

It is a further object of the present invention to provide a high speed programmable frequency divider with a reduced chip count, which in turn reduces the power requirements and the total propagation delay.

It is a further object of the present invention to provide a high speed programmable frequency divider including a variable modulus divider utilizing gallium arsenide semiconductor devices to increase the speed thereof.

These and other objects of this invention will become apparent to those skilled in the art upon consideration of the accompanying specification, claims, and drawings.

BRIEF DESCRIPTION OF THE DRAWINGS

Referring to the drawings, wherein like characters indicate like parts throughout the figures:

FIG. 1 is a simplified block diagram of a phase locked loop embodying the present invention;

FIG. 2 is a block diagram of a high speed programmable frequency divider embodying the present invention; and FIG. 3 is a block diagram of a variable modulus divider utilized in the block diagram of FIG. 2.

DESCRIPTION OF THE PREFERRED EMBODIMENT

Referring specifically to FIG. 1, a block diagram of a phase locked loop (PLL) circuit used in the design of a fast hopping frequency source for a communications system is illustrated. The PLL includes a reference frequency input terminal 10 connected to one input of a phase detector 11. The phase detector 11 has an output connected through a loop filter 12 to the control input of a voltage controlled oscillator (VCO) 15. Phase detector 11 compares a reference frequency applied to terminal 10 to any frequency applied to a second input thereof and supplies a signal, which is a dc signal after filtering, to control the frequency output of VCO 15. The frequency supplied by VCO 15 is available at an output terminal 16 and is also picked off by some type of connection or sensor 17 and supplied to an input terminal of a programmable frequency divider 20. Programmable frequency divider 20 has an external input 21 for receiving a control signal thereon to determine the division accomplished therein. An output terminal of programmable frequency divider 20 is connected to the second input of phase detector 11. Given that the desired output frequency at terminal 47 16 ranges from F1 to F2 and that the desired step size through the range is equal to the reference frequency applied at terminal 10, programmable frequency divider 20 must be able to assume the consecutive integer multiples of the reference frequency input between F1 and F2, thereby allowing all the desired frequencies to be realized. Programmable frequency divider 20 is illustrated in more detail in FIG. 2.

Referring specifically to FIG. 2, input terminal 22 is adapted to receive the output signal of VCO 15 from sensor 17. Input terminal 22 applies the input signal to a wave conditioner 25 which may be any convenient high frequency device capable of converting the sinusoidal signal at input terminal 22 into a stable ECL level square wave. As an example, wave conditioner 25 may be a gigabit logic 10G011 galium arsenide (GaAs) fan-out buffer. The output of wave conditioner 25 is applied to an input of a variable modulus divider (VMD) 27. In the present embodiment VMD 27 requires at least a 1 nanosecond rise time on the input signal for proper operation. This requirement limits the lower frequency operating range of the circuit because lower sinusoidal signals have slower initial rise times. To avoid this limitation VMD 27 is preceded by wave conditioner 25 which has the input sensitivity necessary for converting slow frequency, low level sinusoids into fast edge square waves. For systems in which the range of input frequencies have sufficient rise times and input levels to drive VMD 27, wave conditioner 25 is unnecessary.

In this embodiment VMD 27 is a gigabit logic 10G070 gallium arsenide device which is capable of high speed operation, e.g. 1.25 GHz, and is disclosed in more detail in FIG. 3. VMD 27 has a clock input terminal 28 which receives the input signal from wave conditioner 25. Terminal 28 supplies the input signal to a divide by n/n+1 circuit 30, which circuit has a second input connected to an output of a division logic circuit 31 and which division logic circuit determines whether circuit 30 divides by n or n+1 in accordance with an external signal supplied to a mode terminal 32. An output of circuit 30 is connected to an input of division logic circuit 31 and to an input of a divide by 2 circuit 33. The output of circuit 30 is also available at an output terminal 34. An output of divide by 2 circuit 33 is connected to a third input of division logic circuit 31, to the input of a second divide by 2 circuit 35, and is also available at an output terminal 36. An output of second divide by 2 circuit 35 is connected to a fourth input of divider logic circuit 31, an input of a third divide by 2 circuit 37, and is also available at an output terminal 38. An output of third divide by 2 circuit 37 is available at an output terminal 39. VMD 27 can be programmed to perform one of four division ratio pairs: 5, 6; 10, 11; 20, 21; or 40, 41. To program VMD 27 for one of the division ratio pairs select lines 40, 41, and 42, connected to divide by 2 circuits 33, 35, and 37, respectively, must be connected to appropriate voltage levels. In the present embodiment shown in FIG. 2 only the division ratio pair 5, 6 is used and, consequently, select lines 40, 41, and 42 are connected together and to a voltage level which deactivates divide by 2 circuits 33, 35, and 37.

To control whether a divide by n or divide by n+1 is being performed, mode terminal 32 must have the appropriate ECL level applied thereto. When mode terminal 32 is at a logic high, VMD 27 will divide by 5, 10, 20, or 40. When mode input terminal 32 is at a logic low, VMD 27 will divide by 6, 11, 21, or 41. Since the present embodiment is limited to the 5, 6 division ratio pair, a logic high at mode terminal 32 will cause circuit 30 to divide by 5 and a logic low at mode terminal 32 will cause circuit 30 to divide by 6. The 5, 6 division ratio pair has been selected in this embodiment because of the wide range of consecutive integer division available but, it should be understood by those skilled in the art that additional or other division ratio pairs might be utilized in specific applications.

Output terminal 34 of VMD 27 is connected to the clock input of a programmable counter 45. In this embodiment programmable counter 45 may be, for example, a MECL MC10H136 programmable counter. Programmable counter 45 counts the number of division cycles that VMD 27 has completed. Each output pulse from VMD 27 indicates the completion of either an n or n+1 division cycle. The output pulse, which occurs on the valid output corresponding to the programmed division ratio pair, drives the clock input to programmable counter 45. Programmable counter 45 is a positive-edge triggered device so that each pulse supplied to the clock input will be recorded into the total count. Programmable counter 45 has a 4 lead data input bus 46 connected to the external control terminal 21 (FIG. 1) which is designed to receive a programming signal representative of a predetermined count. Programmable counter 45 is preset with the predetermined count on data input 46 such that when programmable counter 45 reaches terminal count (the maximum capable count) the desired number of division cycles has been completed by VMD 27. When programmable counter 45 reaches terminal count a pulse is generated at the carry out pin to indicate the completion of the cycle. This pulse is supplied to output terminal 47 of programmable frequency divider 20.

Programmable counter 45 has a 4 line bus output 48 which lines are connected to A1 through A4 inputs of a magnitude comparator 50. Programmable counter 45 has two select pins S1 and S2 which control the mode of operation. When both pins have a low voltage thereon, programmable counter 45 is placed in the reset mode. This condition forces the count at outputs 48 to be equivalent to the count supplied to data input lines 46. Using this condition, the starting count of programmable counter 45 can be externally controlled. The other mode of programmable counter 45 used in this embodiment is an increment count designated by pin S1 having a low voltage thereon and pin S2 having a high voltage thereon. In this mode whenever there is a positive edge presented at the clock input of programmable counter 45 the count is incremented. Outputs 48 always have signals thereon which indicate the instant count in programmable counter 45.

In the present embodiment, the internal organization of programmable counter 45 is such that the carry out pin is always in the high state until terminal count is reached at which point it goes low. The carry out pin remains low until the next positive edge is presented at the clock input at which time programmable counter 45 is reset and the carry out pin returns to a high state. It follows that the carry out pin serves as a cyclical output since it sources a pulse at the end of each counting sequence. Further, since pin S1 is connected directly to the clock input, it should be understood that S1 will always be in the low state previous to the positive edge of the clock input. To achieve the above-described modes pin S2 is connected directly to the carry out pin. From the above description, it becomes apparent that programmable counter 45 is in the increment mode at all times except terminal count. When terminal count is reached the carry out pin goes low which means pin S2 is also low. Thus, the next positive clock edge input to programmable counter 45 will reset it to the preset or preprogrammed value contained on data input lines 46. Thus, it can be seen that once an external data word is supplied to data input lines 46 no further operator interface is necessary. Programmable counter 45 increments up to terminal count, resets to the preset count and begins the counting sequence again.

Magnitude comparator 50 is a MECL MC-10H166 device which serves as the mode control for VMD 27. Comparator 50 has two 4-bit input ports, A1-A4 and B1-B4, which permit the following tests on data words: A>B, A<B, or A=B. In the present embodiment, the test A<B is used as the mode control line and is connected to mode terminal 32 of VMD 27. A four line input bus 51 is connected to the B1-B4 input terminals. Bus 51 is connected to external control terminal 21 (see FIG. 1) and is adapted to receive a signal indicative of a predetermined count. Comparator 50 compares the instant count on output bus 48 of programmable counter 45 to the predetermined count supplied to input data lines 51 and outputs a logic level dependent on the result of the test. If the test is true (i.e. A<B) then a logic high is output. If the test is false (e.g. A=B, A>B) a logic low is output. As previously described in conjunction with VMD 27, a logic high input to mode control terminal 32 corresponds to a divide by n and a logic low corresponds to a divide by n+1. Thus, to perform a given division by N as required by the PLL of FIG. 1, it is necessary to load programmable counter 45 with the corresponding number of divide by n and n+1 cycles of VMD 27 which sum up to N. In the specific embodiment illustrated, VMD 27 begins with the divide by n mode and, upon programmable counter 46 reaching an instant count equal to the predetermined number applied to data input lines 51, comparator 50 outputs a logic low which switches VMD 27 to the divide by n+1 mode. It is desirable to have at least one divide by n+1 count to be sure that VMD 27 does not start the next count in the divide by n+1 mode.

In the embodiment illustrated in FIG. 2, the input frequency supplied to input terminal 22 ranges from a maximum frequency of approximately 825 MHz to a minimum frequency of approximately 13 MHz. The consecutive division range (N) using the 5, 6 division ratio pair is 26-90. Using the 10, 11 division ratio pair, and with the wave conditioner 25 removed and the input frequency supplied directly to clock input 28 of VMD 27, the maximum input frequency is approximately 1340 MHz and the minimum frequency is approximately 60 MHz. The consecutive division range (N) using the 10, 11 division ratio pair is 101-165. Utilizing the above parameters some typical settings for programmable frequency divider 20 follow. With a 260 MHz input frequency applied to input terminal 22 from VCO 15 and a 10 MHz reference signal applied to input terminal 10 of the PLL of FIG. 1, a division combination of 4 divide by n's (divide by 5) and 1 divide by n+1 (divide by 6) equal the required division of 26. The 4 bit signal supplied to data input lines 46 will be 1011 which allows 5 more counts in programmable counter 45 before the terminal count is reached. Further, a 4 bit signal 1111 is applied to data input lines 51 of comparator 50 so that the output line of comparator 50 goes to a logic low level after four counts ar registered in programmable counter 45. The final count, which is a divide by n+1 mode in VMD 27, drives programmable counter 45 to the terminal count which in turn causes the output line of magnitude comparator 50 to go to a logic high level. By adding divide by n or divide by n+1 counts the division range can continue consecutively up to a division of 90. A division of 90 is achieved with 0 divide by n and 15 divide by n+1 steps. For this division the signal supplied to data input lines 46 is 4 logic zeros and the signal supplied to data input lines 51 is 4 logic zeros. Thus, since the count in programmable counter 45 is set to be equal to the preselected count supplied to data input lines 51 the output of magnitude comparator 50 is a logic low level and the mode of VMD 27 is immediately switched to divide by n+1. After 15 divisions in the n+1 mode programmable counter 45 reaches the terminal count and produces an output pulse which resets programmable counter 45 for the next division. The remaining 63 consecutive divisions between 26 and 90 can easily be worked out by those skilled in the art. It will of course be realized by those skilled in the art that utilizing other division ratio pairs and other reference frequencies at the input to the PLL will alter the size and number of consecutive integer multiples available.

As the input frequency to high speed programmable frequency divider 20 is increased, timing problems will eventually appear in the reset process of programmable counter 45. During testing of the disclosed embodiment of high speed programmable frequency divider 20 it was found that the major timing problem resided in the mode control switching process of VMD 27. Reversing the division sequence to start in the divide by n+1 mode and switch to the divide by n mode was considered but it was discovered that the time required by the mode control decision process is symmetrical (i.e. it takes as much time to switch from n to n+1 as it does from n+1 to n) so that reversing the division sequence would not solve the timing problem. Thus, at least for the division ratio pairs utilized herein the specific division sequence is not crucial.

As stated above, previously the most efficient means of accomplishing consecutive integer division was limited to a maximum frequency of approximately 600 MHz and a minimum division value of 90. In the embodiment disclosed utilizing the divide by 5/divide by 6 mode and the wave conditioner 25 the maximum operating frequency is not only increased to approximately 825 MHz but the minimum consecutive integer value is also lowered to 26. In the embodiment utilizing the divide by 10/divide by 11 mode and not utilizing wave conditioner 25 the division range is 101 to 165 (approximately similar to current capabilities) but the maximum operating frequency is extended to approximately 1340 MHz. While gallium arsenide devices in the high frequency components are chiefly responsible for substantial increase in maximum operating frequency, it should be noted that the present invention incorporates a substantial reduction in chip count (e.g. one counter versus two counters in the prior art) which not only reduces the power required but also reduces the total propagation delay, thereby increasing the speed or the maximum operating frequency of the high speed programmable frequency divider. A further point to be made involves the emphasis which is presently being placed on low-valued consecutive integer division. It is well-known among PLL circuit designers that the value of the division (N) in the feedback loop effects many of the loop characteristics. One of the most important effects is the phase noise. Within the loop bandwidth, the phase noise present at the output of VCO 15 is equal to the reference phase noise multiplied by the value of N in the feedback loop. Obviously, to control the phase noise, the value of N must be made as small as possible. A smaller N, however, requires the controlling logic in programmable frequency divider 20 to operate at a higher speed. Thus, the importance of the value of N is clear.

While we have shown and described specific embodiments of this invention, further modifications and improvements will occur to those skilled in the art. We desire it to be understood, therefore, that this invention is not limited to the particular forms shown and we intend in the appended claims to cover all modifications which do not depart from the spirit and scope of this invention.

What is claimed is:

1. A high speed programmable frequency divider comprising:
   a variable modulus divider having a high frequency signal input, a mode control input, and an output, said variable modulus divider being constructed to switch to a selected one of a plurality of modes in response to a mode control signal on the mode control input and to divide a high frequency signal supplied to the high frequency signal input by a different predetermined number in each of the plurality of modes;

a programmable counter having a signal input connected to the output of said variable modulus divider, a data input for receiving a programming signal to preprogram said programmable counter to a predetermined count, a count output having a signal thereon indicative of an instant count in said programmable counter, and a final count output;

a signal comparator having a first input connected to the count output of said programmable counter, a second input for receiving a signal indicative of a desired instant count, and a mode control signal output connected to the mode control input of said variable modulus divider; and wave conditioning mean having a high frequency signal input and an output connected to the high frequency signal input of the variable modulus divider for converting sinusoidal input signals to emitter coupled logic level signal square waves.

2. A high speed programmable frequency divider as claimed in claim 1 wherein the variable modulus divider is a gallium arsenide semiconductor device.

3. A high speed programmable frequency divider as claimed in claim 2 wherein the programmable counter and the signal comparator are emitter coupled logic devices.

4. A high speed programmable frequency divider as claimed in claim 1 wherein the variable modulus divider has two modes, one in which the high frequency signal is divided by five and in the other of which the high frequency signal is divided by six.

5. A method of programmably dividing a high frequency signal comprising the steps of:

providing a variable modulus divider having a high frequency signal input and an output, the variable modulus divider being switchable between a first mode in which a high frequency signal applied to the signal input is divided by a first number and a second mode in which the high frequency signal applied to the signal input is divided by a second number;

selecting a number of first mode divisions and a number of second mode divisions required to obtain a desired total division of a high frequency signal;

supplying the high frequency signal to be divided to the signal input of the variable modulus divider;

counting the number of divisions by the variable modulus divider and comparing the instant count to the selected number of first mode divisions;

switching the variable modulus divider to the second mode when the instant count is equal to the selected number of first mode divisions; and continuing to count the number of divisions by the variable modulus divider and providing an output signal when the instant count is equal to the desired total division.

* * * * *